United States Patent [19]

Asai et al.

[11] Patent Number: 4,747,198
[45] Date of Patent: May 31, 1988

[54] METHOD AND APPARATUS FOR DETECTING HOLD-POSITION OF ELECTRONIC COMPONENT, AND APPARATUS FOR MOUNTING ELECTRONIC COMPONENT

[75] Inventors: Koichi Asai; Mamoru Tsuda; Yasuo Muto, all of Chiryu, Japan

[73] Assignee: Fuji Machine Mfg. Co., Ltd., Japan

[21] Appl. No.: 908,017

[22] PCT Filed: Jan. 20, 1986

[86] PCT No.: PCT/JP86/00020

§ 371 Date: Sep. 12, 1986

§ 102(e) Date: Sep. 12, 1986

[87] PCT Pub. No.: WO86/04479

PCT Pub. Date: Jul. 31, 1986

[30] Foreign Application Priority Data

Jan. 21, 1985 [JP] Japan .................. 60-8809
Jan. 21, 1985 [JP] Japan .................. 60-8810
Jan. 21, 1985 [JP] Japan .................. 60-8811

[51] Int. Cl.⁴ .......................................... B23Q 17/22
[52] U.S. Cl. ........................................ 29/407; 29/709;
29/712; 29/721; 29/743; 29/760
[58] Field of Search ............... 29/407, 709, 712, 720,
29/721, 729, 743, 760, DIG. 44; 901/47

[56] References Cited

U.S. PATENT DOCUMENTS 4,529,315  7/1985  Cohen et al. ............... 901/47 X
4,598,456  7/1986  McConnell .................. 29/407
4,615,093  10/1986 Tews et al. ................. 29/709 X
4,628,464  12/1986 McConnell .................. 29/721 X
4,654,964  4/1987  Schneider et al. ........... 29/407 X
4,675,993  1/1987  Harada ...................... 29/743 X

FOREIGN PATENT DOCUMENTS

0041041    5/1981  European Pat. Off. .
51-30700   3/1976  Japan .
52-135165  11/1977 Japan .
57-15436   1/1982  Japan .
57-164310  10/1982 Japan .
59-28399   2/1984  Japan .
59-24439   7/1984  Japan .

Primary Examiner—Howard N. Goldberg
Assistant Examiner—Joseph M. Gorski
Attorney, Agent, or Firm—Parkhurst & Oliff

[57] ABSTRACT

Are disclosed a method of detecting a hold-position of an electronic component in which the component is held by an electronic-component holding apparatus, an electronic-component holding apparatus having a hold-position detecting device, and an electronic-component mounting apparatus for mounting an electronic component on a printed-circuit board. The above method includes the steps of emitting light beams in a direction toward the electronic component (W) held by the electronic-component holding apparatus (58, 70), so as to take a projection of the component, and of detecting a position of the projection, thereby detecting the hold-position of the component. The above holding apparatus is characterized in that at least a part of a holding head body (86) which surrounds a center line of a sucking pipe (88) is made of a transparent material, and in that the holding apparatus has the hold-position detecting device which includes a light emitter (146) for emitting light beams in a direction parallel to the center line of the sucking pipe so as to take a projection of the component held by the sucking pipe, and further includes an electronic image device (150) for detecting a position of the projection. The above mounting apparatus has at least one holding head (70) which is stopped at a pair of intervening stops between a receive-stop at which the head receives the component and a mount-stop at which the head mounts the component on the board, at one of the intervening stops the hold-position of the component being detected, at the other intervening stop an incorrect hold-position of the component being adjusted.

14 Claims, 9 Drawing Sheets

METHOD AND APPARATUS FOR DETECTING HOLD-POSITION OF ELECTRONIC COMPONENT, AND APPARATUS FOR MOUNTING ELECTRONIC COMPONENT

FIELD OF THE ART

The present invention relates to a method of detecting a hold-position of an electronic component in which the electronic component is held by an electronic-component holding apparatus utilizing attraction by vacuum suction or grip by a pair of gripping jaws for the holding of the component, to an electronic-component holding apparatus having a hold-position detecting device, and to an electronic-component mounting apparatus for mounting an electronic component on a mount member such as a printed circuit board.

RELATED ART STATEMENT

The above-identified electronic-component holding apparatus is widely used, for example, in an apparatus for automatically mounting electronic components on a printed-circuit board.

The document of Japanese Patent Application published under Publication No. 58-213496 discloses to detect using an image device a hold-position of an electronic component in which the component is held by an electronic-component holding apparatus as indicated above, and to substantially adjust any incorrect hold-position, by means of rotating a holding head which keeps hold of the component and/or of re-positioning a printed-circuit board on which the component is to be mounted, based on the result from the detection.

However, since the image device of the apparatus disclosed is adapted to detect the electronic component by utilizing light reflected by the component, the image device is liable to be badly influenced by roughness and/or tone of color on the surface of the component. Thus, there has been experienced a problem that the image device is incapable of detecting the hold-position for some electronic components. Moreover, in the case where a single image device is responsible for various kinds of electronic components, it is very difficult for the image device to detect all the components, with precision.

Figure 11:
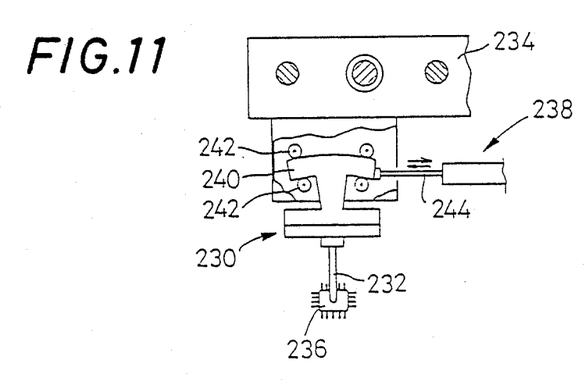
FIG. 11 is a plane view showing an example of a conventional electronic-component holding apparatus.

The above-identified document of Japanese Patent Application No. 58-213496 further discloses an electronic-component mounting apparatus for automatically mounting an electronic component on a mount such as a printed-circuit board, in which the component is re-positioned by means of rotation thereof about an axis thereof with a holding head before the mounting. This mounting apparatus is shown in FIG. 11. The holding head in the form of a sucking head 230 is supported by a head support 234 such that the sucking head 230 is rotatable about a center line of a sucking portion of a sucking pipe 232 which is capable of holding an electronic component by means of sucking action therethrough. An image device (not shown) detects a rotational (angular) position of the electronic component 236 about a center line of the sucking portion. Based on the result from the detection, a head rotator 238 rotates the sucking head 230 by an angle required for adjustment of the rotational position (posture) of the component 236. Then, the component 236 is mounted on a mount such as a printed-circuit board. Thus, electronic components are mounted on the mount with higher precision, because each electronic component 236 is mounted after adjustment of the incorrect hold-position (posture) of the component 236 in which the component 236 is held by the sucking head 230.

However, the head rotator 238 of the above-indicated electronic-component mounting apparatus is disposed on the head support 234 which supports the sucking head 230 such that the sucking head 230 is rotatable, and therefore is moved together with the head support 234. This construction results in increased mass of a portion which moves together with the sucking head 230. Accordingly, it is very difficult to move the sucking head 70 at a high speed, and to increase the efficiency of the work for mounting the electronic components on the mount.

The sucking head 230 of the mounting apparatus disclosed has a held portion 240 which has a shape of an arc having a center on the center line of the sucking portion of the sucking pipe 232. The held portion 240 is supported by the head support 234 through guide rolls 242. The head rotator 238 has an operating arm 244 which is at one end thereof in contact with one end of the held portion 240, and rotates the held portion 240 through the operating arm 244. Therefore, the maximum rotation of the sucking head 230 is limited to a comparatively small angle. The electronic-component mounting apparatus is capable of adjusting an incorrect hold-position of the component 236 about the center line of the sucking portion, but incapable of rotating the component 236 a large angle such as 45 degrees, 90 degerees or 180 degrees, before mounting the component 236 on the printed-circuit board or the like.

Because the maximum rotation of the sucking pipe 232 is narrowly limited as described above, the sucking head 230 must be returned to its initial rotational position each time the sucking head 230 has mounted one electronic component. Otherwise, the sucking head 230 will disadvantageously reach one of both limits of a maximum-rotation range in which the head 230 is rotatable, as a result of the head 230 being rotated little by little in one direction in the case where a number of electronic components 236 are successively held by the head 230, each having an incorrect rotational position in the same direction.

Further, there is well-known an electronic-component mounting apparatus of a type having a head support which is rotated about a rotation axis thereof intermittently, i.e., a predetermined angle at a time, and a plurality of holding heads supported by the head support such that the holding heads are apart from each other on a circle by the same angle as the predetermined angle. In this mounting apparatus, each holding head receives an electronic component at a receive-stop as one of stops at which the holding heads are stopped, and mounts the component on a printed-circuit board or the like at a mount-stop other than the receive-stop. A number of electronic components are held by the holding heads, and successively mounted on the printed-circuit board, as the head support is intermittently rotated in one direction. Thus, a cycle time that is a time period required for mounting one electronic component on a mount is shortened in this mounting apparatus, and the efficiency of the work for mounting electronic components on the mount is increased.

However, the cycle time is increased and the mounting-work efficiency is lowered, in the case where the operations of receiving the electronic comopnent, of detecting a hold-position of the component received, and adjusting an incorrect hold-position of the component are conducted at the one and only stop.

Further, in the case where the head rotator is disposed on the head support which supports the holding heads in a rotatable fashion and moved together with the head support, the number of the head rotator(s) should be equal to the number of the holding head(s). In this case, the mounting apparatus becomes complex in construction and therefore costs higher.

The present invention has been developed in the above-indicated situations, and it is therefore an object of the invention to provide for a method of precisely detecting a hold-position of an electronic component held by a holding apparatus, irrespective of roughness or tone of color on the surface of the component, and provide for an apparatus for practicing the method.

It is another object of the invention to provide for an electronic-component mounting apparatus which mounts electronic components on a mount such as a printed-circuit board, with high precision and efficiency, and which has a simple construction.

DISCLOSURE OF THE INVENTION

According to a first aspect of the present invention, there is provided a method of detecting a hold-position of an electronic component in which the component is held by an electronic-component holding apparatus, the method including the steps of emitting light beams in a direction toward the component held by the holding apparatus, so as to take a projection of the electronic component, and of detecting a position of the projection, thereby detecting the hold-position of the electronic component. The hold-position detected may include a rotational (angualar) position of the component about a rotation axis thereof and/or a position of the component on a plane perpendicular to the rotaion axis of the component.

By using the above method, the hold-position of any kind of electronic component is accurately detected. This is because the projection of the component upon which the hold-position is detected is free from the influence of roughness or tone-of-color on the surface of the component. Although the projection does not represent details of an inner portion surrounded by an outline, the outline, if it is clean, is satisfactorily usable for accurately detecting the hold-position of the component.

According to a second aspect of the invention, there is provided an electronic-component holding apparatus having a holding head which includes a head body and a sucking pipe supported at one end thereof by the head body and capable of holding at the other end thereof an electronic component by means of vacuum suction therethrough, wherein at least a part of the head body which surrounds a center line of the sucking pipe is made of a transparent material, and wherein the electronic-component holding apparatus further has a hold-position detecting device which includes a light emitter for emitting light beams in a direction parallel to the center line of the sucking pipe so as to take a projection of the electronic component held by the sucking pipe, and further includes electronic image means for detecting a position of the projection of the electronic component.

The above holding apparatus is capable of accurately detecting the hold-position of the electronic component, because it takes a clean projection of the component, i.e., a complete projection without any flaws or missings, by means of utilizing the light beams having passed through the transparent part of the sucking head parallelly to the center line of the sucking pipe, and uses the projection for detecting the hold-position. At the same time, the present holding apparatus has a simplified construction because of employing the electronic image means which directly senses the projection of the component. The electronic image means also contributes to increasing the accuracy of detection of the hold-position.

It is simplest but not essential to arrange the light emitter and the electronics image means on the one and only optical axis. In one embodiment of the above-indicated holding apparatus, the hold-position detecting device also includes reflection means for changing a direction of passing of the light beams from the light emitter to the electronic image means, whereby the light emitter and the electronic image means are positioned relative to each other such that the light emitter and the electronic image means have different optical axes. That is, the relative arrangement between the light emitter and the image means may be altered according to peripheral circumstances.

In another embodiment of the above-indicated holding apparatus, the head body includes a tubular member, a pair of transparent plates secured to the tubular member such that the transparent plates are parallel to each other and apart from each other axially of the tubular member, so as to define a substantially air-tight space within the tubular member, a communication passage formed through the tubular member so as to communicate between the space and a vacuum source, and a through-hole formed through one of the transparent plates in a direction of thickness thereof, the sucking pipe being supported by the head body with the one end thereof inserted through the through-hole of the one transparent plate. This embodiment enjoys an advantage that the air-tight space as a passage for communicating between the sucking pipe and the vacuum source is not projected on the electronic image means. More specifically described, the air-tight space defined by the tubular member and the two transparent plates does not produce a problem with such a passage formed through a transparent body, i.e., a problem that, when light beams pass through the transparent body so as to make the projection of the component on the image means, the light beams are partially reflected by a side wall of the passage so that the passage may be also projected on the image means.

According to a third aspect of the invention, there is provided an electronic-component mounting apparatus for mounting an electronic component on a mount such as a printed-circuit board, the apparatus having; (a) at least one holding head including a head body and a sucking pipe supported at one end thereof by the head body and capable of holding at the other end thereof the electronic component by means of vacuum suction therethrough, at least a part of the head body which surrounds a center line of the sucking pipe being made of a transparent material; (b) a head moving device supporting the at least one holding head, and moving the holding head from a receive-stop at which the holding head receives the electronic component from an electronic-component supply to a mount-stop at which the holding head mounts the electronic component on the mount, by way of at least one intervening stop; and (c) a hold-position detecting device including a light emitter for emitting light beams in a direction parallel to the center line of the sucking pipe so as to take a projection of the electronic component held by the sucking pipe, and further including electronic image means for detecting a position of the projection of the electronic component, the hold-position detecting device being disposed at a detect-stop which is one of the at least one intervening stop.

In a preferred embodiment of the above mounting apparatus, the head moving device has a head support which is rotatable about a rotation axis thereof by a predetermined angle at a time, the head support supporting a plurality of the holding heads such that the holding heads are spaced from each other by the predetermined angle about the rotation axis of the head support and that each of the holding heads is rotatable about a rotation axis thereof.

In another embodiment of the electronic-component mounting apparatus, the at least one holding head is supported by the head moving device such that the holding head is rotatable about a rotation axis thereof perpendicular to a direction of movement thereof, while the at least one intervening stop include a rotate-stop between the detect-stop and the mount-stop, and the mounting apparatus further includes a head rotator disposed at the rotate-stop and rotating the holding head stopped at the rotate-stop, by means of engagement with the holding head, about the rotation axis of the holding head by an angle determined based upon the hold-position of the electronic component which is detected by the hold-position detecting device.

In a preferred form of the above-indicated embodiment, each of the at least one holding head has a driven rotor having a circular cross section, a center line of the driven rotor lying on the rotation axis of the holding head, while the head rotator has a drive rotor having a circular cross section and being engageable with the driven rotor, an actuator for bringing the drive rotor into contact with or away from the driven rotor, and drive means for causing the drive rotor to be rotated.

In the electronic-component mounting apparatus constructed as described above, each holding head is moved in order from the receive-stop, through the detect-stop and the rotate-stop, to the mount-stop. At the receive-stop, the holding head receives the electronic component from the electronic-component supply. At the detect-stop, the holdposition of the component held by the holding head is detected by the hold-position detecting device using the electronic image means. At the rotate-stop, the head rotator rotates the holding head by an angle determined based upon the hold-position detected at the detect-stop, so that the rotational position of the hold-position of the component is adjusted. And at the mount-stop, the holding head mounts the component which has been re-positioned at the rotate-stop, on the mount such as a printed-circuit board.

In the case where a single head rotator is responsible for rotating a plurality of holding heads so as to adjust the hold-position of the component held by each of the heads, the mounting apparatus has a simplified construction and therefore costs lower.

Furthermore, in the case where the head rotator is fixed at a location away from the head support, a portion which is moved together with the holding head(s) has a reduced rotational inertia. Thus, the head moving device becomes small, and the vibration and noise associated with movements and stoppings of the holding head(s) is reduced, permitting the holding head(s) to be rotated at a higher speed. As a result, the efficiency of the work for mounting the electronic compnents on the mount is increased.

In the case where the head support is adapted to support a plurality of holding heads and be rotated intermittently, i.e., by a predetermined angle at a time, the operations of receiving the electronic component, of detecting the hold-position of the component by means of the hold-position detecting device, of rotating the component by means of the head rotator so as to adjust the hold-position, and of mounting the comopnent on the mount are concurrently performed. Therefore, the cylcle time of the mounting apparatus is shorter than in conventional apparatus, and the mounting-work efficiency of the mounting apparatus is increased.

In the case where the drive rotor of the head rotor and the driven rotor of the holding head are adapted to each have a circular cross section and be engageable with each other, the engagement and disengagement between the drive rotor and the driven rotor takes place at any relative angular position therebetween. Consequently, the head rotator has only to have a function of rotating the holding head an angle required for adjusting an incorrect hold-position of the component. In other words, the head rotator need not have a function of returning the holding head to its initial (reference) angular position each time the holding head has mounted one electronic component.

In the previously-indicated preferred form of the mounting apparatus, the driven rotor may have an inside friction surface which defines therein a cylindrical space, while the drive rotor may have a swelling portion which is frictionally engageable with the inside friction surface of the driven rotor, the actuator moving the drive rotor in a direction of an axis of the drive rotor so as to bring the drive rotor into or out of the cylindrical space in the driven rotor, the actuator further causing the swelling portion of the drive rotor to be expanded radially outwardly of the drive rotor so as to frictionally engage the drive rotor with the driven rotor.

In the above case, a frictional force developed from frictional engagement between the drive rotor and the driven rotor is an internal force of a system consisting of the drive rotor and the driven rotor, and does not act on other members which suppport the drive rotor or the driven rotor. Therefore, even when a considerably large frictional force is developed between the drive and driven rotors, the holding head and the head rotator are not moved relative to each other. Accordingly, the rigidity of the mounting apparatus can be reduced. This contributes to rotating the holding head at a higher speed because of reduced mass of the portion moved together with the holding head, and also to reducing the cost of the mounting apparatus.

Furthermore, the drive rotor may have a tubular rotor body a part of which is to be inserted into the inside friction surface of the driven rotor, an annular member made of an elastic material and mounted on the inserted part of the rotor body, a plurality of through-holes formed through the inserted part of the rotor body inside the annular member such that the through-holes extends radially of the rotor body and equiangularly spaced from each other circumferencially of the inserted part, balls accommodated in the through-holes such that the balls are movable in the through-holes, and an operating member received in the rotor body such that the operating member is movable axially of the rotor body, the operating member having at one end thereof a tapered portion which is engageable with the ball in the through-hole, relative movement of the operating member with respect to the rotor body in a direction of an axis of the rotor body causing the annular member to be expanded as a result of the balls being moved by the tapered portion of the operating member, thereby causing the annular member to be frictionally engaged with the inside friction surface, the balls and the annular member cooperating with each other to serve as the swelling portion.

In the above case, the mounting apparatus has a simplified construction, and costs lower.

Moreover, between the operating member and the rotor body, may be provided an elastic member which biases the operating member in a direction in which the tapered portion of the operating member is brought into a non-operation position thereof where the tapered portion is apart from the balls, the actuator causing the swelling portion to be inserted into the inside friction surface by means of moving the rotor body along the axis of the rotor body through the operating member and the elastic member, the actuator causing the operating member to be moved relative to the rotor body against a biasing force of the elastic member after completion of insertion of the swelling portion into the inside friction surface, thereby causing the swelling portion to be expanded radially outwardly of the rotor body, through the tapered portion and the balls.

In this case, the actuator has only to move the operating member along the axis of the operating member in order to cause the swelling portion of the drive rotor to be inserted into the inside friction surface of the driven rotor and to be subsequently expanded. Thus, the construction of the mounting apparatus is further simplified. The reduction in cost of the apparatus is also achieved.

In another preferred form of the electronic-component mounting apparatus according to the third aspect of the invention, the head moving device further has brake means for inhibiting the at least one holding head from rotation thereof by means of engagement of the brake means with the holding head or with a member which is rotatable together with the holding head, while the head rotator has brake-releasing means for releasing the brake means out of the above engagement while the head rotator is rotating the holding head.

In the above case, the holding head is free from unexpected rotation thereof due to vibration or impact accompanied with movements of the head support, and is readily rotated when required to be rotated. Thus, any incorrect hold-position of the electronic component held by the holding head is adjusted more precisely.

MOST PREFERRED EMBODIMENT FOR PRACTICING THE INVENTION

There will be described in detail one embodiment of the present invention with reference to the accompanying drawings.

Figure 1:
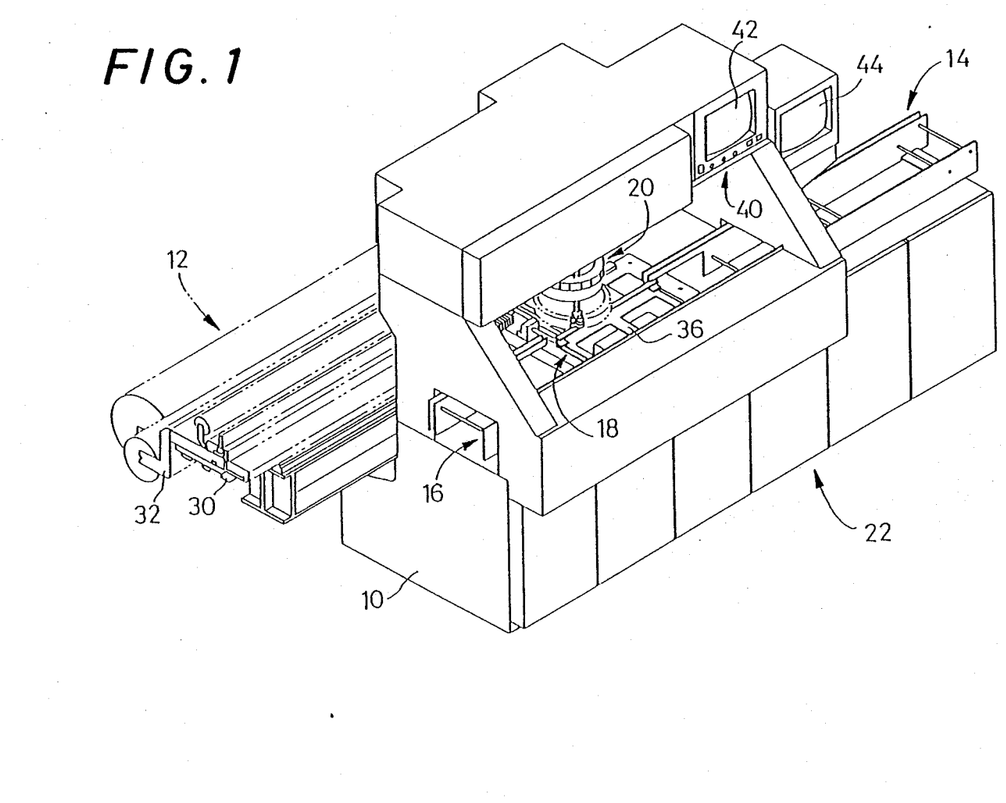
FIG. 1 is a perspective view showing one embodiment of an electronic-component mounting apparatus of the present invention.

Referring first to FIG. 1, there is shown an external view of an electronic-component mounting apparatus as one embodiment of the invention. The instant electronic-component mounting apparatus has a housing 10, an electronic-component supply 12, a board feed-in device 14, a board feed-out device 16, a board positioning device 18 and an electronic-component mounting device 20. The housing 10 supports a supply support 30 such that the supply support 30 is movable along a straight line on the housing 10. The electronic-component supply 12 consists of a number of supply units 32 which are mounted on the supply support 30 and arranged in a row and in close contact with each other, in a direction of movement of the supply support 30. Each of the supply units 32 is provided with tape-supported electronic components, and is brought with the movement of the supply support 30 into a position in which the unit 32 directly faces the electronic-component mounting device 20 and supplies the mounting device 20 with one electronic component at a time. A further description about the electronic-component supply 12 is omitted because the supply 12 is well known.

A printed-circuit board on which electronic components are to be mounted is fed in by the board feed-in device 14, and loaded on the board positioning device 18 by a loader (not shown). The board positioning device 18 has a board support 36, and the board support 36 is mounted on an X-Y table which is movable in a direction of an X-axis of the mounting apparatus parallel to the direction of movement of the supply support 30, and in a direction of a Y-axis direction of the apparatus perpendicular to the X-axis direction. Thus, the positioning device 18 supports the printed-circuit board and precisely locates the board at any position on a X-Y plane defined by the X and Y axes. The electronic-component mounting device 20 receives an electronic component one after another from the electronic-component supply 12, and successively mount the components on the printed-circuit board located in position by the positioning device 18. After all the electronic components have been mounted on the printed-circuit board, the board is unloaded from the positioning device 18 by an unloader (not shown), and fed out by the board feed-out device 16. All the operations above indicated are controlled by a controller 22. The controller 22 incorporates a computer as a major unit, and controls the devices in the present mounting apparatus according to internal programs stored in memories and external information entered through, for example, magnetic disks or tapes. The controller is provided with a control panel 40, a display 42, and a monitor 44. The display 42 displays indications entered through the control panel 40, information entered externally, operating conditions of the devices, or the like. The monitor 44 is used for the operator to monitor a hold-position of an electronic component in which the component is held by a sucking head unit (described below) as a holding head for holding the component. The board feed-in and feed-out devices 14 and 16, board positioning device 18, controller 22, control panel 40, display 42 and monitor 44 are all well-known, and therefore further illustrations about those devices are skipped. And there will be described in detail the electronic-component mounting device 20.

Figure 2:
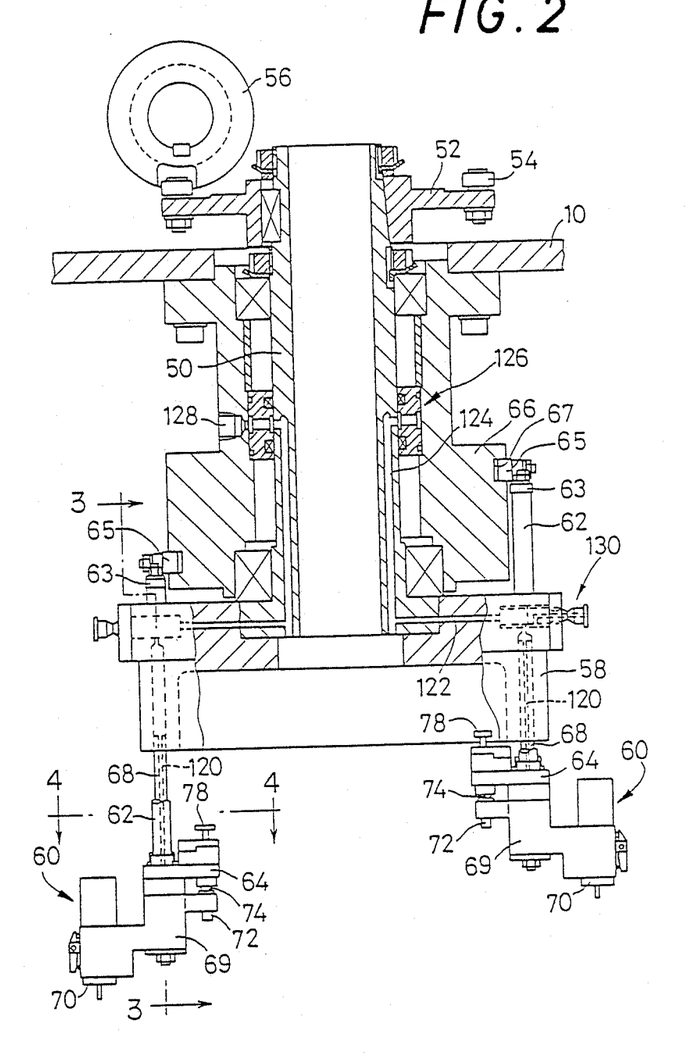
FIG. 2 is a front elevational view in cross section showing a mounting device used in the mounting apparatus of FIG. 1.

Referring next to FIG. 2, the electronic-component mounting device 20 has an axle 50 which is supported by the housing 10 such that the axle 50 is rotatable about a vertical rotation axis thereof. A disk 52 is fixed to an upper-end portion of the axle 50, and rotatable together with the axle 50. Twelve cam followers 54 are secured to the disk 52 such that the followers 54 are equiangularly spaced from each other circumferentially of the disk 52. Reference numeral 56 designates a cam 56 which is rotatable about a horizontal rotation axis thereof. The cam 56 is disposed relative to the cam followers 54 such that the cam 56 is engageable with the cam followers 54, and that a 360 degrees rotation (one rotation) of the cam 56 about its rotation axis causes a 30 degrees rotation of the disk 52 and the axle 50. The disk and the axle 50 are rotated intermittently, i.e., 30 degrees by each rotation of the cam 56.

Figures 3, 4:
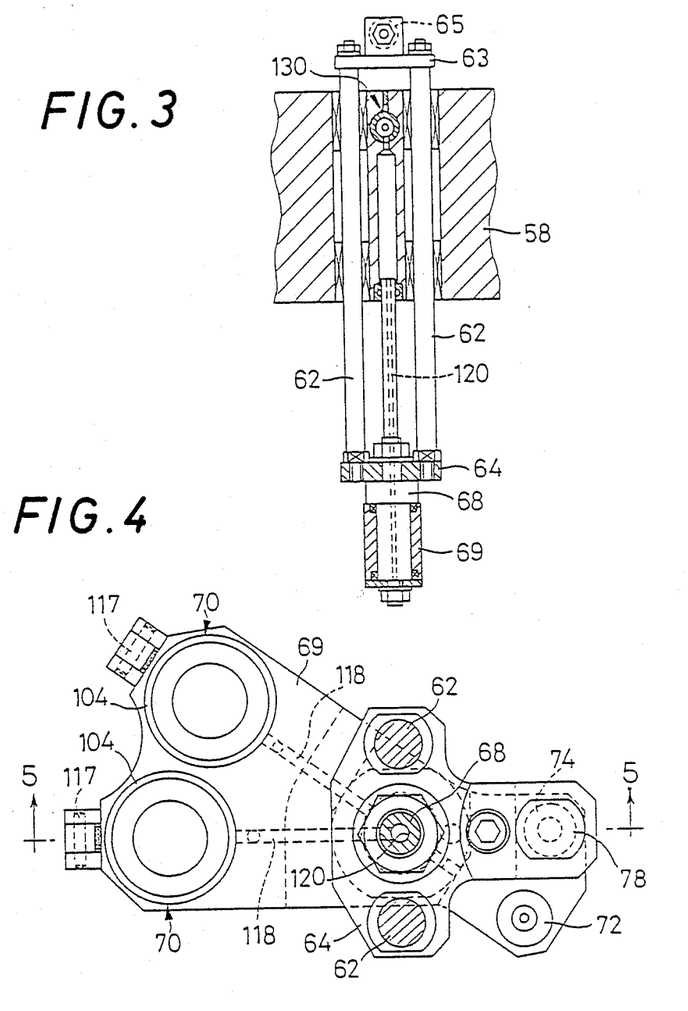
FIG. 3 is a cross sectional view taken along 3—3 of FIG. 2.
FIG. 4 is a cross sectional view taken along 4—4 of FIG. 2.
Figure 5:
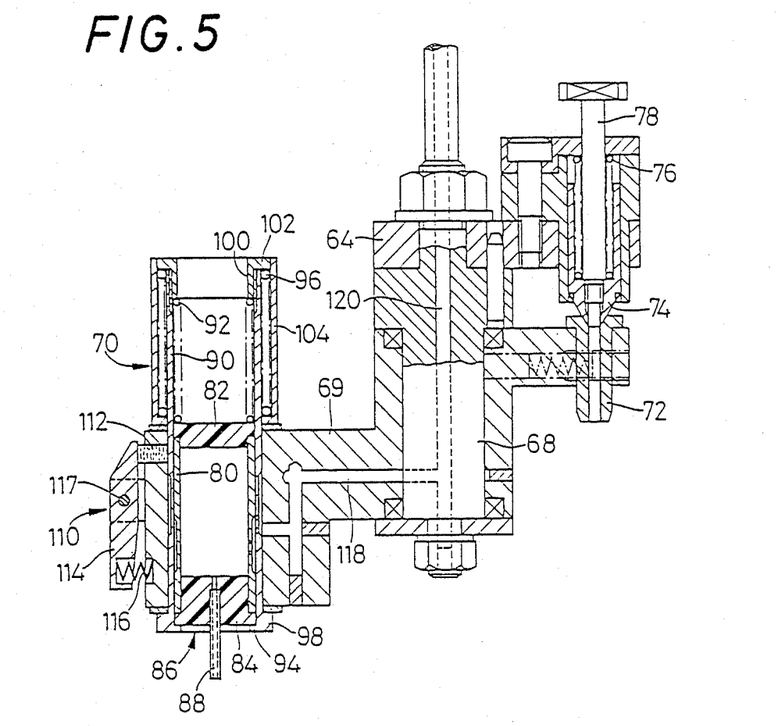
FIG. 5 is a cross sectional view taken along 5—5 of FIG. 4.

A head support 58 with a circular cross section is fixed to a lower-end portion of the axle 50. Twelve sucking head units 60 are secured to the head support 58 such that the sucking head units 60 are equiangularly spaced from each other about the rotation axis of the axle 50. All the twelve sucking head units 60 have the same construction that is shown in FIGS. 3 through 5. Referring to FIG. 3, each of the twelve head units 60 that are positioned on a peripheral portion of the head support 58 has a pair of vertical rods 62 which are movable in a direction of axes thereof and which are connected to each other at opposite ends thereof by means of an upper and a lower connector 63 and 64. The upper connector 63 is provided with a cam follower 65 which is engaged with a cam 66 with a circular cross section as shown in FIG. 2. The cam 66 is fixed to the housing 10, and has in an outside surface thereof an annular cam groove 67 which is deformed or inclined with respect to a horizontal plane that is perpendicular to the vertical rods 62. The engagement of the cam follower 65 with the inclined cam groove 67 of the cam 66 causes the rods 62 to be moved up and down, as the head support 58 is rotated together with the axle 50.

The lower connector 64 is provided with an axletree 68 and an arm 69. The arm 69 is supported by the axletree 68 such that the arm 69 is rotatable about a vertical rotation axis thereof. As clearly shown in Fig. 4, the arm 69 has at one end thereof a pair of sucking heads 70 as holding head for holding an electronic component. At the other end, the arm 69 has a pair of positioning bushes 72. The pair of sucking heads 70 and the pair of positioning bushes 72 lie on respective arcs which have the common center on the rotation axis of the arm 69. The angle contained by a pair of center lines of the two sucking heads 70 with respect to the rotation axis of the arm 69 is equal to that contained by a pair of center lines of the two positioning bushes 72 with respect to the rotation axis of the arm 69. Referring to FIG. 5, the lower connector 64 is further provided with a positioning pin 74. The positioning pin 74 is received by the lower connector 64 such that the pin 74 is vertically movable in the connector 64 and is normally biased downwardly by a spring 76. The positioning pin 74 has a tapered portion at a lower end thereof, while each positioning bush 72 has a tapered hole at an upper end thereof. With the tapered portion of the pin 74 engaged with the tapered hole of the bush 72 by a biasing force exerted by the spring 76, the arm 69 is inhibited from rotation thereof about its rotation axis. Thus, either sucking head 70 is fixed at an operation position in which the sucking head 70 is capable of holding the electronic component. Out of the two sucking heads 70, the more desirable one is selected according to the kind of the electronic component to be held. The engagement of the pin 74 with the bush 72 is released as an operating member 78 fixed to the pin 74 is upwardly moved by an actuator (not shown) against the downward biasing force of the spring 76. In this condition, as the arm 69 is rotated by an arm rotator (not shown), the other sucking head 70 is brought into the operation position.

As most clearly shown in FIG. 5, each sucking head 70 has a head body 86 including a tubular member 80 made of a metallic material, and an upper and a lower transparent plate 82 and 84 made of glass or of a synthetic resin. The upper and lower plates 82 and 84 are secured to an upper and a lower end of the tubular member 80, respectively, so that a substantially air-tight space is formed within the head body 86. The lower transparent plate 84 has a vertical through-hole in which a sucking pipe 88 is press-fitted. The through-hole formed through the lower plate 84 communicates between the air-tight space within the head body 86 and the sucking pipe 88. The head body 86 is received by an outer sylinder 90 such that the head body 86 is not rotatable relative to the outer cylinder 90, and that the head body 86 is movable in a direction of an axis of the outer cylinder 90. The head body 86 is normally located by a spring 92 in a lower position thereof in which the head body 86 is in contact with a stopper 94. The outer cylinder 90 is received by a vertical through-hole formed in the previously-indicated arm 69, such that the outer cylinder 90 is rotatable, and movable in a direction of an axis of the through-hole of the arm 90. The outer cylinder 90 is normally located by a springe 96 in an upper position thereof in which a flange 98 of the cylinder 90 is in contact with the arm 69. A driven rotor 102 is fixed to an upper end of the outer cylinder 90 by screwing the driven rotor 102 into the outer cylinder 90. The driven rotor 102 has an inside friction surface defining therein a cylindrical space with a center line of the cylindrical space lying on a center line of the sucking pipe 88. The driven rotor 102 and the spring 96 are protected by a cover 104.

The arm 69 is provided with a brake device 110 for inhibiting the sucking head 70 (outer cylinder 90 and head body 86) from rotation thereof. The brake device 110 includes a friction member 112, a lever 114, a spring 116, and a pin 117. The lever 114 is fixed to the arm 69 with the pin 117 such that the lever 114 is rotatable about the pin 117. The friction member 112 is fixed at one end thereof to one end of the lever 114. The spring 116 is fitted between the other end of the lever 114 and the arm 69. The other end of the friction member 112 is received by a through-hole formed in the arm 69 such that the tip of the other end of the friction member 112 is in forced contact with an outer surface of the outer cylinder 90, by a biasing force of the spring 116, so as to inhibit the sucking head 70 from rotation thereof.

The previously-indicated sucking pipe 88 communicates with a vacuum source (not shown), via the airtight space within the head body 86, a passage 118 formed in the arm 69, a passage 120 formed in the axletree 68, a passage 122 formed in the head support 58, a passage 124 formed in the axle 50, a joint 126, and a port 128. A switch valve 130 is disposed at a joint portion between the passage 120 and the passage 122. The switch valve 130 is selectively place by a switching device (not shown) in one position thereof in which the sucking pipe 88 communicates with the vacuum source or in the other position thereof in which the sucking pipe 88 communicates with an ambient air.

Figure 6:
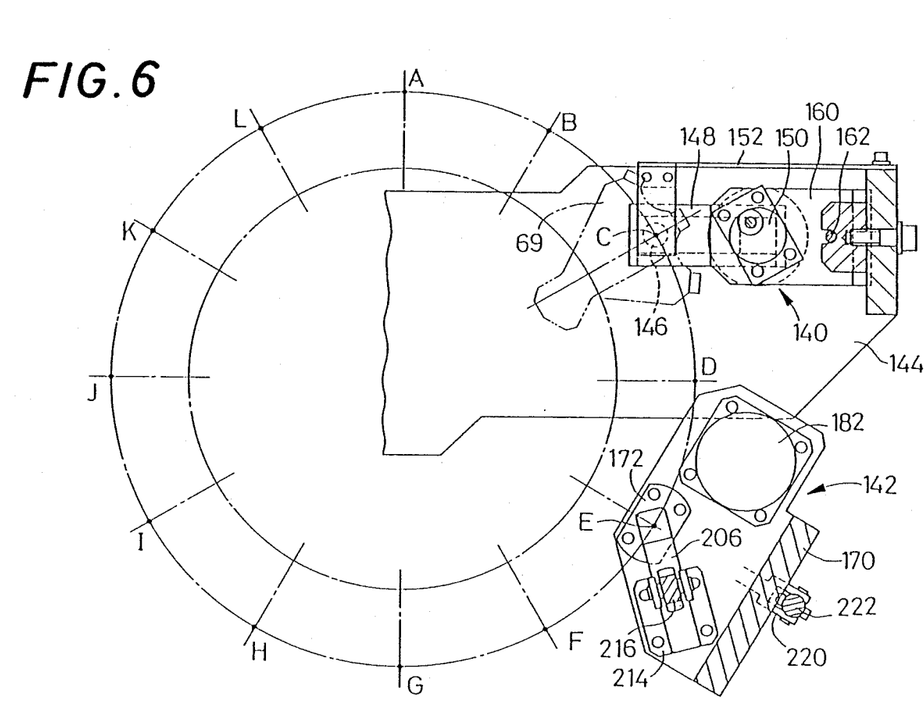
FIG. 6 is an illustrative view in cross section taken along 6—6 of FIGS. 7 and 8, showing the relative positions of a hold-position detecting device and a head rotator, which are used in the mounting apparatus of Fig. 1, with respect to the mounting device of FIG. 2.

Referring next to FIG. 6, there are illustrated twelve stops A through L at which each sucking head 70 is orderly stopped as the head support 58 is rotated intermittently, i.e., 30 degrees at a time. At stop A, the sucking head 70 receives an electronic component from the electronic-component supply 12, and at stop G the sucking head 70 mounts the component on a printed-circuit board. Hence, stop A is referred to as receive-stop, while stop G as mount-stop. Between stops A and G there are provided some intervening stops. At intervening stop C, there is disposed a hold-position detecting device 140, while at intervening stop E there is disposed a head rotator 142. That is, stop C is referred to as detect-stop, while stop E as rotate-stop. In the case where the electronic component held by the sucking head 70 has been found, from the result of detection at stop C, to be not a correct one, the electronic component is released from the sucking head 70 at stop D, as a result of the switch valve 130 being switched over.

Figure 7:
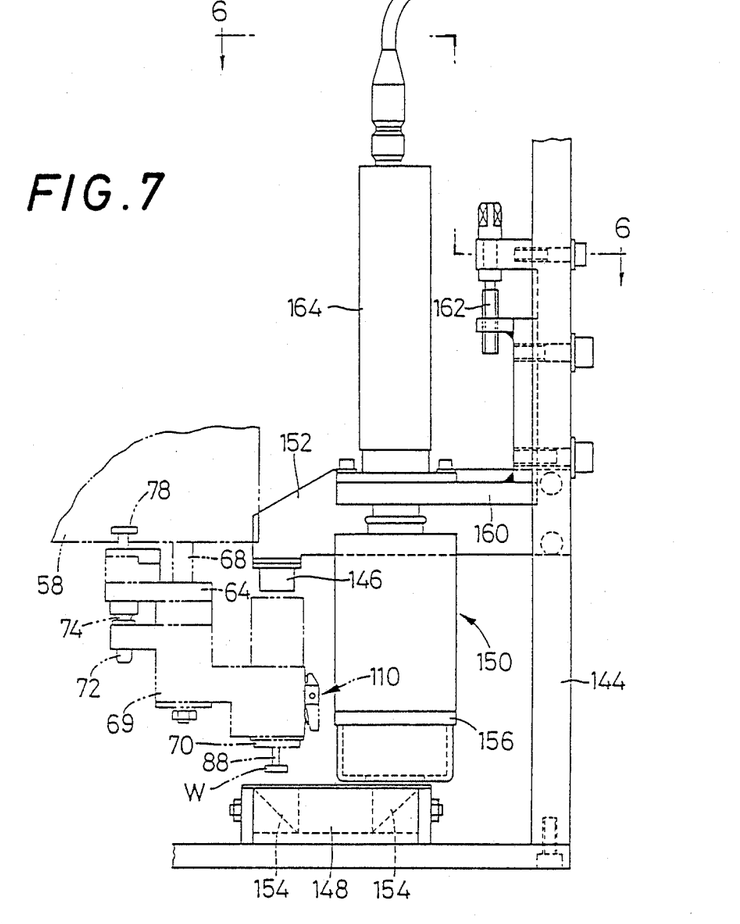
FIG. 7 is a front elevational view of the hold-position detecting device of FIG. 6.

As clearly shown in FIG. 7, the hold-position detecting device 140 includes a light emitter 146 secured to an accessory frame 144 fixed to the housing 10, a prism system 148, and an electronic image device 150. The light emitter 146 is secured to the accessory frame 144 by means of a bracket 152, and disposed right above the sucking head 70 stopped at the detect-stop (stop C). Light beams emitted by the light emitter 146 pass through the sucking head 70 in a direction parallel to a center line of the sucking head 70, and then are changed in direction by 90 degrees and further 90 degrees by a pair of prisms 154 of the prism system 148. After all, the electronic image device 150 receives the light beams passing in a direction opposite to the direction in which the light emitter 146 emits the light beams initially. The electronic image device 150 has a lens 156, and converts a projection of the electronic component W which is formed on a screen of solid image sensors (not shown) through the lens 156, into binary-coded signals. The electronic image device 150 is secured to the accessory frame 144 with the help of a bracket 160, and a facal distance of the image device 150 is adjustable by way of moving the bracket 160 up and down by operating an adjustor knob 162. Reference numeral 164 designates a power supply for the electronic image device 150.

Figure 8:
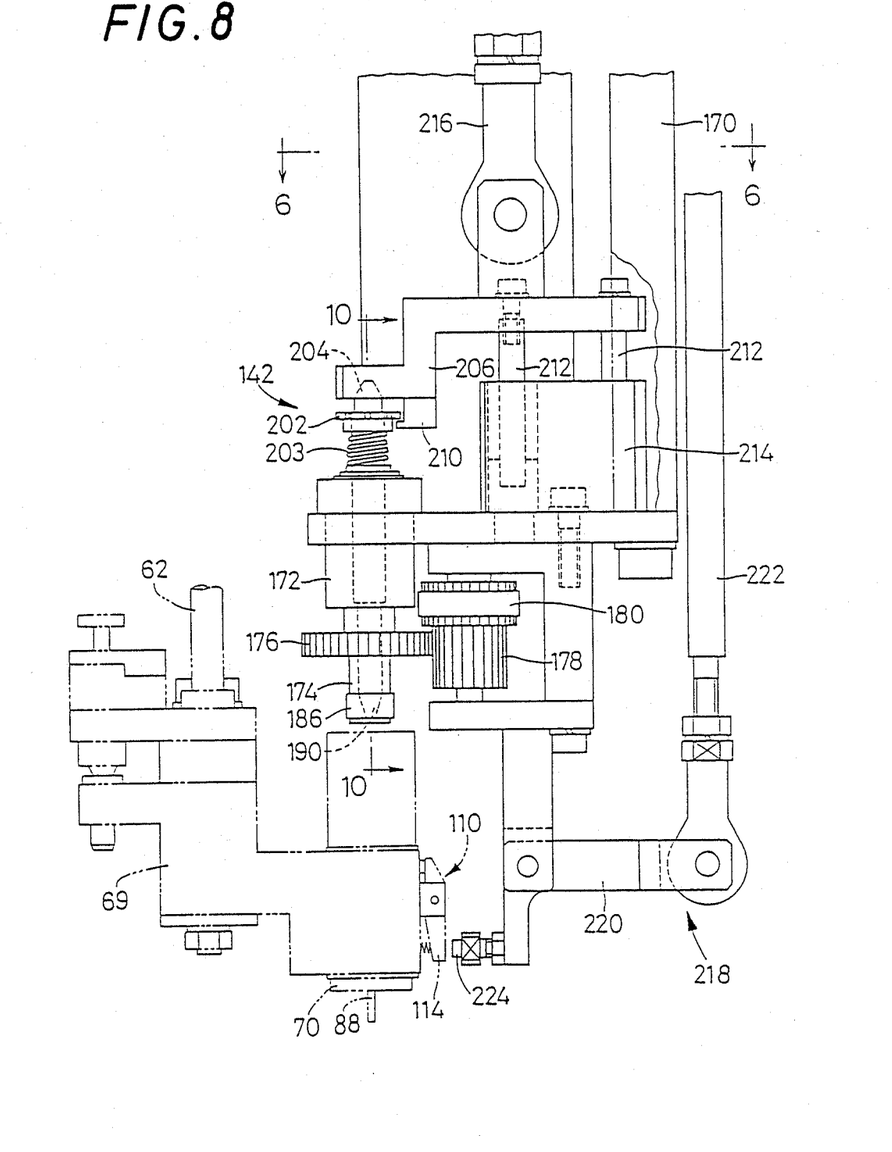
FIG. 8 is a front elevational view showing the head rotator of FIG. 6 and a brake-releasing device.
Figure 9:
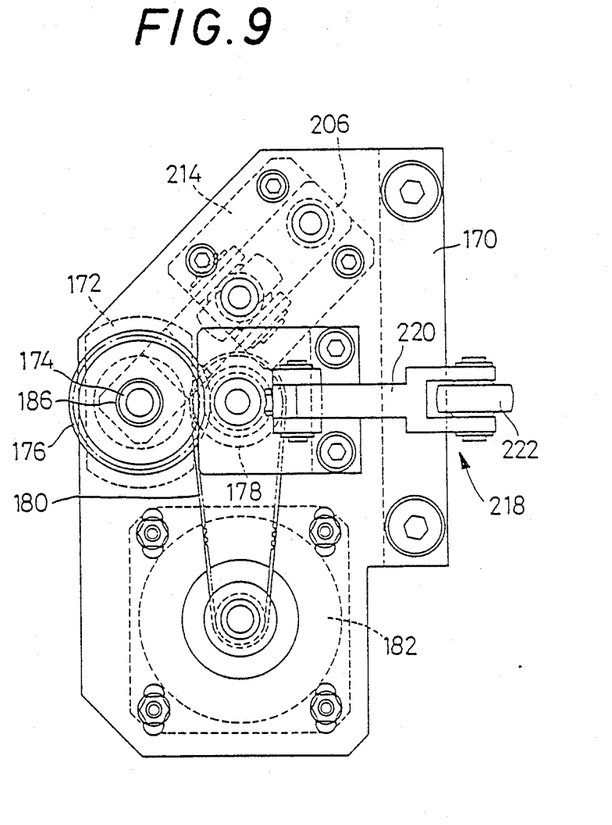
FIG. 9 is a plane view of the head rotator and the brake-releasing device of FIG. 8, as seen from the bottom thereof.

As shown in FIG. 8, the head rotator 142 has a drive rotor which includes as a major part thereof a drive rotor body 174. The rotor body 174 is supported by a guide bush 172 such that the rotor body 174 is rotatable about a rotation axis thereof and movable in a direction of an axis thereof. The rotor body 174 is provided with a gear 176 which is connected to a servo motor 182 (shown in FIG. 9) via a gear 178 and a timing belt 180. The rotor body 174 is rotated any angle by the servo motor 182.

Figure 10:
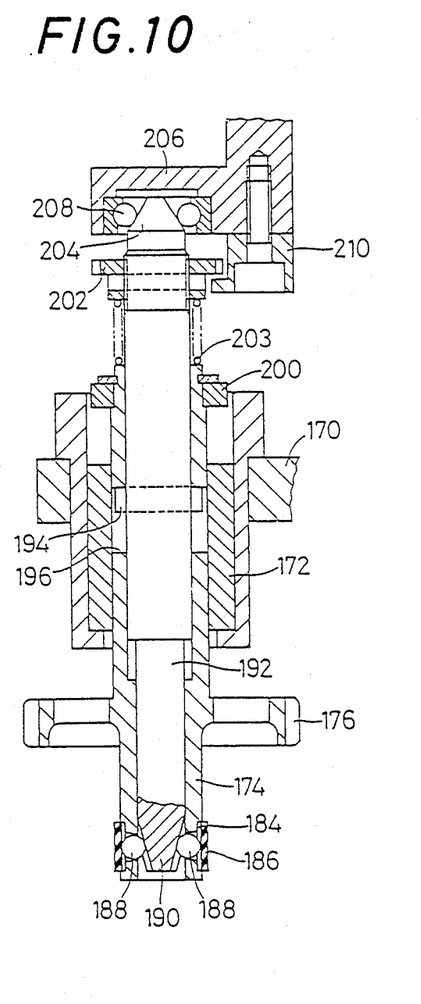
FIG. 10 is a cross sectional view taken along 10—10 of FIG. 8.

The drive rotor body 174 is a tubular member as shown in FIG. 10, and has in an outer surface of a lower-end portion thereof an annular, wide groove 184 in which is fitted a friction ring 186 made of a rubber material. The tubular rotor body 174 also has a plurality of through-holes which are formed through a bottom wall of the wide groove 184, radially of the rotor body 174. Each of these through-holes accommodates a ball 188 such that the ball 188 is movable in the through-hole. The rotor body receives therein an operating member 192 having at a lower end thereof a tapered portion 190, such that the operating member 192 is slidable within the rotor body 174. The operating member 192 has a pin 194 fixed thereto, while the rotor body 174 has a wide hole 196. With the pin 194 engaged with the wide hole 196, the operating member 192 and the rotor body 174 are inhibited from relative rotation therebetween, and limited in relative movement therebetween in their axial direction, to a width of the wide hole 196.

The drive rotor body 174 has at an upper-end portion thereof a stopper ring 200 fixed thereto. The downward movement of the rotor body 174 is limited by the guide bush 172, at a lower position of the rotor body 174 in which the stopper ring 200 is in contact with an upper end of the guide bush 172. The operating member 192 has around an upper end thereof a nut 202 fixed thereto, and between the nut 202 and an upper end of the rotor body 174 there is disposed a spring 203 which biases the operating member 192 upwardly relative to the rotor body 174. The operating member 192 also has at the upper end thereof a tapered portion 204 which is engaged with an up-down member 206 through bearings 208. Reference Numeral 210 designates an engagement member fixed to the up-down member 206. The engagement member 210 is engageable with the nut 202 so as to cooperate with the up-down member 206 to move the operating member 192 up and down.

As can be understood from FIG. 8, the up-down member 206 is supported by the accessory frame 170 via a pair of rods 212 and a guide block 214, such that the up-down member is movable up and down. The up-down member 206 is connected via a connector rod 216 to a cam device (not shown) for moving the up-down member 206 up and down. In FIG. 8, the up-down member 206, rods 212, guide block 214 and connector rod 216 are illustrated as they are after rotated a certain angle about the rotation axis of the drive rotor body 174, for prompt understanding.

The head rotator 142 is disposed at stop E such that a center line of the head rotator 142 is aligned with a center line of the sucking head 70 stopped at stop E. When the up-down member 206 is moved downwardly, the drive rotor body 174 is moved downwardly together with the up-down member 192, so that the lower end of the rotor body 174 on which the friction ring 186 is mounted is inserted into the driven rotor 102 (see FIG. 5) of the sucking head 70. The downward movement of the rotor body 174 is stopped when the stopper ring 200 is brought into contact with the upper end of the guide bush 172, i.e., when the rotor body 174 is located in its lower position. After the downward movement of the rotor body 174 is stopped at its lower position, the operating member 192 is further moved downwardly relative to the rotor body 174 against the biasing force of the spring 203, so that the tapered portion 190 wedges off the balls 188 radially outwardly of the rotor body 174 so as to partially expand the friction ring 186. As a result, the friction ring 186 is frictionally engaged with the inside friction surface 100. The balls 188 and the friction ring 186 cooperate with each other to serve as a swelling portion of the drive rotor, while the operating member 192 with the tapered portion 190 serves as an operator (actuator) mechanism.

In FIG. 8, there is illustrated a brake-releasing device 218 for releasing the brake device 110. The accessory frame 170 is provided with a fixed release lever 220 of the brake-releasing device 218. The release lever 220 is connected at one end thereof to a connector rod 222 and at the other end thereof to an operating part 224. The connector rod 222 is connected to the previously-described connector rod 216 via the not-shown cam device, such that the connector rod 222 is moved up and down in association with the connector rod 216. Described in detail, after the drive rotor body 174 is moved downwardly and then the friction ring 186 is pressed against the inside friction surface 100 of the driven rotor 102, the operating part 224 works on the lever 114 so as to release the brake device 110. Subsequently, the sucking head 70 is rotated by a required angle. Before the rotor body 174 is disengaged from the driven rotor 102, the brake device 110 is returned to its braking operation.

Hereinafter there will be described the operation of the electronic-component mounting apparatus as a whole. When at stop A (receive-stop) of FIG. 6 one sucking head 70 is receiving an electronic component from the electronic-component supply 12, at stop C (detect-stop) another sucking head 70 is undergoing a detection by the hold-position detecting device 140, i.e., are detected a rotational position of the component W (held by the sucking head 70) with respect to the rotation axis of the head 70 and a position of the component W when projected on a plane perpendicular to the rotation axis of the head 70, at stop E (rotate-stop) still another sucking head 70 is being rotated by the head rotator 142 so that the rotational position of the component W with respect to the rotation axis of the head 70 is adjusted, i.e. the component W is re-positioned about the rotation axis of the head 70, and at the same time at stop G (mount-stop) a further sucking head 70 is mounting the component W on a printed-circuit board. The above-indicated operations at stops A, C, E, and G are conducted parallelly on the different sucking heads 70. Here, attention is drawn to one single sucking head 70, and each operation will be illustrated in detail as the one sucking head 70 goes through those stops in order.

When a sucking head 70 is stopped at stop A, a selected one of the number of supply units 32 of the electronic-component supply 12 is positioned right below the sucking head 70. In this condition, a tape-supported electronic component W is accessible on the selected supply unit 32 after a covering tape is removed from the component-supporting tapes. If the driven rotor 102 (FIG. 5) is pushed downwardly by a head-pushing device (not shown) against a biasing force of the spring 96, the head body 86 and the sucking pipe 88 are also moved downwardly so that a lower end of the sucking pipe 88 is brought into contact with an upper surface of the electronic component W. After that, the driven rotor 102 and the outer cylinder 90 are further moved downwardly, but the head body 86 and the sucking pipe 88 are not moved any longer because the spring 92 is compressed. In this condition, the electronic component W is held by the sucking pipe 88 through vacuum suction from the not-shown vacuum source which communicates with the sucking pipe 88. Next, when the sucking head 70 is moved upwardly due to releasing of the head-pushing device from its pushing action, the electronic component W is also moved upwardly. Thus, the operation at stop A is finished, that is, the electronic-component mounting device 20 has received the component W from the electronic-component supply 12.

After receiving the electronic component W at stop A, the sucking head 70 goes to stop C by way of stop B. At stop C, the sucking head 70 is located between the light emitter 146 and the prism system 148 as shown in FIG. 7. Light beams emitted by the light emitter 146 forms a projection of the component W on a screen of the solid image sensors of the electronic image device 150. The electronic image device 150 converts the projection into binary-coded signals, and supplies them to the controller 22. The controller 22 compares the supplied binary-coded signals with reference binary-coded signals representative of a correct hold-position of the component W which are stored in the memories of the controller 22, and calculates $\Delta\theta$, $\Delta X$, and $\Delta Y$; $\Delta\theta$ is an angular difference between the rotational (angular) position of the component W and the reference, correct rotational position, and $\Delta X$ and $\Delta Y$ are a positional difference between the position of the component W and the reference, correct position on the X-Y plane defined by the X and Y axes of the instant electronic-component mounting apparatus.

After undergoing the detection at stop C, the sucking head 70 goes through stop D to stop E at which the sucking head 70 is located right below the drive rotor of the head rotator 142 (see FIG. 8). As the up-down member 206 is moved downwardly by the not-shown cam device, the lower-end portion of the drive rotor body 174 is inserted into the driven rotor 102 (see FIG. 5). If the up-down member 206 is further moved downwardly, the operating member 192 is moved downwardly relative to the rotor body 174 (see Fig>10), and the balls 188 and the friction ring 186 are wedged off radially outwardly of the rotor body 174 so as to be pressed against the inside friction surface 100 of the driven rotor 102. Subsequently, the brake-releasing device 218 is actuated to release the brake device 110 out of operation, i.e., inhibit the brake device 110 from its braking action. Now, the sucking head 70 is in a condition for being rotated. As the servo motor is driven, the sucking head 70 is rotated. In this case, the servo motor 182 is rotated by an angle corresponding to the value $\Delta\theta$ that has been determined by the controller 22, and the sucking head 70 and the electronic component W held by the head 70 are rotated an angle required to eliminate the difference $\Delta\theta$ between the detected rotational position of the component W and the reference rotational position. Next, the brake device 100 is again in operation, the up-down member 206 is moved upwardly, and the drive rotor body 174 is disengaged from the driven rotor 102. Thus, the operation at stop E, i.e., the adjustment of the rotational position of the electronic component W is finished.

While the sucking head 70 goes from stop E at which the head 70 underwent the adjustment of its rotational position, to stop G by way of stop F, the printed-circuit board on which the sucking head 70 will mount the component W is located at a position which has been determined based on the values ΔX and ΔY so as to eliminate the positional difference between the position of the component W and the reference position on the X-Y plane defined by the X and Y axes (directions) of the present mounting apparatus. When the sucking head 70 is moved downwardly by the not-shown head-pushing device, the electronic component W held by the sucking head 70 is pressed on the printed-circuit board, and fixed at a pre-determined spot on the board with the help of, for example, an adhesive. Successively, the switch valve 130 is switched over, and the sucking pipe 88 is brought into communication with the ambient air (atmosphere). As a result, the electronic component W is released from the sucking head 70, and then the sucking head 70 is moved upwardly. Thus, the operation at stop G, i.e., the mounting of the component W on the printed-circuit board is finished.

As can be easily understood from the foregoing description, the electronic-component mounting apparatus of the present invention utilizes the projection of the electronic component W which is formed on the screen of the solid image sensors of the electronic image device 150. Projections do not involve a problem with images which are taken utilizing light reflected from an object, such as a bad influence of the roughness or the tone of color on the surface of the object. Therefore, the hold-position of the electronic component W in which the component W is held by the holding device is detected with precision.

The present mounting apparatus performs the plural operations at the different stops at a time, i.e., the operations of receiving an electronic component W, of detecting the hold-position of the component W, of rotating the component W, and of mounting the component W on a printed-circuit board. Thus, the cycle time is shortened, and the efficiency of the work for mounting the electronic components is increased.

In this connection, it is easily understood that the order of the above-indicated stops may be changed, and a single stop may be responsible for a plurality of operations out of the above-indicated operations. For example, a single stop may be designed to work as both the rotate-stop and the mount-stop.

The above-described mounting apparatus finds wide applications, because each of the twelve arms 69 supported by the head support 58 has a pair of sucking heads 70 so that out of the two sucking heads 70 the more desirable one can be selected according to the profile and dimensions of the electronic component W to be held.

Contrary, it is possible to use a movable member which supports a single holding head and moves the holding head along a circle or a straight line as a route of movement of the holding head.

It is appreciated that the sucking head 70 has the transparent plates 82 and 84 around the sucking pipe 88. This construction permits the light beams from the light emitter 146 to pass through the sucking head 70 in a direction parallel to the center line of the sucking head 70, i.e., the center line of the sucking pipe 88. Thus, a clean projection is formed on the screen of the image sensors of the electronic image device 150, and a precise detection of the hold-position of the component W is obtained.

The sucking head 70 with the sucking pipe 88 may be replaced by other systems for holding an electronic component W, or may be used together with such other systems. For example, a sucking head having a pair of gripping jaws is advantageously employed. In short, the present mounting apparatus employs such a holding head as is capable of holding an electronic component such that a hold-position of the component W held is precisely detected based on a part of the projection of the component W, such as a part consisting of one side with both end portions (edges), or a part consisting of a pair of intersecting sides. In this connection, in the case where light beams emitted by a light emitter so as to take a projection of the component W are obstructed by, for example, a member supporting or actuating the grippig jaws, it is possible to use the light beams which are inclined by a certain angle with respect to a center line of the component W.

In the electronic-component mounting apparatus described above, the hold-position detecting device 140 and the head rotator 142 are each responsible for the 24 sucking heads 70. Therefore, the apparatus is simplified in construction, and costs low in manufacturing. Further, it is appreciated that the head rotator 142 is disposed at its fixed position apart from the head support 58. This arrangement permits the head support 58 to have a reduced rotational inertia and rotate at a higher speed, while restricting vibration or noise due to intermittent rotations of the head support 58.

In the illustrative embodiment of the invention, the swelling portion of the drive rotor is adapted to be mechanically expanded. However, appropriate modifications may be applied to the swelling portion. For example, the swelling portion may be adapted to be expanded with fluid pressure. The fictional engagement of the swelling portion of the drive rotor with the inside friction surface 100 of the driven rotor 102 is not essential for the engagement of the drive rotor with the driven rotor 102. This engagement between the drive rotor and the driven rotor 102 is achieved through fitting of the driven rotor 102 in the swelling portion of the drive rotor and subsequent frictional engagement of the swelling portion with an outside friction surface of the driven rotor 102. Further, that engagement is achieved through frictional engagement between the opposed ends of the drive rotor and the driven rotor which are positioned concentric with each other, or through frictional engagement between the outside friction surfaces of the two members after radial, relative movement therebetween, or through frictional engagement of the outside friction surface of the smaller one of the two with the inside friction surface of the larger one of the two. In these cases, the up-down member (actuator) for causing the two members to be brought into contact with each other or disengaged from each other is modified according to the selected modification for the frictional engagement between the two members.

Concerning stop E (rotate-stop) of the illustrated embodiment, there has been described only the function of adjusting an incorrect rotational position of the component W held by the sucking head 70. However, at this stop, the electronic component can be rotated an angle necessary for bringing the component into another posture, such as 90 degrees or 180 degrees. In this case, the board positioning device 18 for positionig the printed-circuit board is capable of precisely locating the board at any position, even though the device 18 does not have a function of rotating the board.

It will be understood that the present invention may be embodied with various other changes, modifications, and improvements that may occur to those skilled in the art, without departing from the concept and scope of the invention.

What is claimed is:

1. A method of detecting a hold-position of an electronic component in which said electronic component is held by a sucking pipe of an electronic-component holding apparatus by means of vacuum suction through said sucking pipe, the outline of said sucking pipe being wholly enclosed by the outline of the held electronic component as viewed in a direction parallel to a center line of said sucking pipe, said method being characterized by comprising the steps of:

emitting light beams from one side of said electronic component in said direction toward said electronic component held by said sucking pipe;

taking a whole projection of said electronic component on the other side of said electronic component, said whole projection including said outline of said electronic component as viewed in said direction; and     detecting a position of said whole projection, thereby detecting said hold-position of said electronic component.

2. A method according to claim 1, wherein said electronic-component holding apparatus further comprises support means for supporting said sucking pipe at one axial end thereof, at least a part of said support means surrounding said center line of said sucking pipe and being made of a transparent material; and wherein the step of emitting said light beams comprises passing said light beams through at least a portion of said transparent material of said support means.

3. A method according to claim 1, wherein the step of detecting said position of said whole projection comprises converting said whole projection into binary-coded signals, comparing said binary-coded signals with reference binary-coded signals representative of a reference position for said electronic component, said reference position including a reference angular position and a reference X-Y position, and obtaining an angular difference between an angular position of said whole projection and said reference angular position and a difference between an X-Y position of said whole projection and said reference X-Y position, the angular positions being determined with respect to said center line of said sucking pipe and the X-Y positions being determined on an X-Y plane which is perpendicular to said center line of said sucking pipe.

4. An electronic-component holding apparatus having a holding head which includes a head body and a sucking pipe supported at one end thereof by said head body and capable of holding at the other end thereof an electronic component by means of vacuum suction therethrough, characterized in that:

at least a part of said head body (86) which surrounds a center line of said sucking pipe (88) is made of a transparent material, and in that     said electronic-component holding apparatus further has a hold-position detecting device (140) which includes a light emitter (146) for emitting light beams in a direction parallel to said center line of said sucking pipe so as to take a projection of said electronic component held by said sucking pipe, and further includes electronic image means (150) for detecting a position of said projection of the electronic component.

5. An electronic-component holding apparatus according to claim 4, wherein said hold-position detecting device (140) also includes reflection means for changing a direction of passing of said light beams from said light emitter (146) to said electronic image means (150), whereby said light emitter and said electronic image means are positioned relative to each other such that the light emitter and the electronic image means have different optical axes.

6. An electronic-component holding apparatus according to claim 4, wherein said head body (86) includes a tubular member (80), a pair of transparent plates (82, 84) secured to said tubular member such that said transparent plates are parallel to each other and apart from each other axially of said tubular member, so as to define a substantially air-tight space within said tubular member, a communication passage formed through said tubular member so as to communicate between said space and a vacuum source, and a through-hole formed through one of said transparent plates in a direction of thickness thereof, said sucking pipe (88) being supported by said head body with said one end thereof inserted through said through-hole of said one transparent plate.

7. An electronic-component mounting apparatus for mounting an electronic component on a mount such as a printed-circuit board, comprising:

at least one holding head (70) including a head body (86) and a sucking pipe (88) supported at one end thereof by said head body and capable of holding at the other end thereof said electronic component by means of vacuum suction therethrough, at least a part of said head body which surrounds a center line of said sucking pipe being made of a transparent material;

a head moving device (50, 52, 54, 56, 58) supporting said at least one holding head, and moving the holding head from a receive-stop at which the holding head receives said electronic component from an electronic-component supply (12) to a mount-stop at which the holding head mounts said electronic component on said mount, by way of at least one intervening stop; and     a hold-position detecting device (140) including a light emitter (146) for emitting light beams in a direction parallel to said center line of said sucking pipe so as to take a projection of said electronic component held by said sucking pipe, and further including electronic image means for detecting a position of said projection of the electronic component, said hold-position detecting device being disposed at a detect-stop which is one of said at least one intervening stop.

8. An electronic-component mounting apparatus according to claim 7, wherein said head moving device (50, 52, 54, 56, 58) has a head support (58) which is rotatable about a rotation axis thereof by a predetermined angle at a time, said head support supporting a plurality of said holding heads (70) such that said holding heads are spaced from each other by said predetermined angle about said rotation axis of the head support and that each of said holding heads is rotatable about a rotation axis thereof.

9. An electronic-component mounting apparatus according to claim 7, wherein said at least one holding head (70) is supported by said head moving device (50, 52, 54, 56, 58) such that the holding head is rotatable about a rotation axis thereof perpendicular to a direction of movement thereof, while said at least one intervening stop include a rotate-stop between said detect-stop and said mount-stop, and the electronic-component mounting apparatus further comprises a head rotator (142) disposed at said rotate-stop and rotating the holding head stopped at said rotate-stop, by means of engagement with the holding head, about said rotation axis of the holding head by an angle determined based upon said hold-position of the electronic component which is detected by said hold-position detecting device (140).

10. An electronic-component mounting apparatus according to claim 9, wherein each of said at least one holding head (70) has a driven rotor (102) having a circular cross section, a center line of said driven rotor lying on said rotation axis of the holding head, while said head rotator has a drive rotor (174, 186, 188, 192) having a circular cross section and being engageable with said driven rotor, an actuator (206) for bringing said drive rotor into contact with or away from said driven rotor, and drive means (176, 178, 180, 182) for causing said drive rotor to be rotated.

11. An electronic-component mounting apparatus according to claim 10, wherein said driven rotor (102) has an inside friction surface (100) which defines therein a cylindrical space, while said drive rotor (174, 186, 188, 192) has a swelling portion (186, 188) which is frictionally engageable with said inside friction surface of the driven rotor, said actuator (206) moving the drive rotor in a direction of an axis of the drive rotor so as to bring the drive rotor into or out of said cylindrical space in the driven rotor, said actuator further causing said swelling portion of the drive rotor to be expanded radially outwardly of the drive rotor so as to frictionally engage the drive rotor with the driven rotor.

12. An electronic-component mounting apparatus according to claim 11, wherein said drive rotor has a tubular rotor body (174) a part of which is to be inserted into said inside friction surface (100) of said driven rotor, an annular member (186) made of an elastic material and mounted on said inserted part of said rotor body, a plurality of through-holes formed through the inserted part of the rotor body inside said annular member such that said through-holes extend radially of said rotor body and are equiangularly spaced from each other circumferentially of the inserted part, balls (188) accommodated in said through-holes such that said balls are movable in the through-holes, and an operating member (192) received in said rotor body such that said operating member is movable axially of said rotor body, said operating member having at one end thereof a tapered portion (190) which is engageable with said balls, relative movement of said operating member with respect to said rotor body in a direction of an axis of the rotor body causing said annular member to be expanded as a result of said balls being moved by said tapered portion of said operating member, thereby causing the annular member to be frictionally engaged with the inside friction surface, said balls and said annular member cooperating to serve as said swelling portion (186, 188).

13. An electronic-component mounting apparatus according to claim 12, wherein between said operating member (192) and said rotor body (174) is provided an elastic member (203) which biases said operating member in a direction in which said tapered portion of the operating member is brought into a non-operation position thereof where the tapered portion is apart from said balls (188), said actuator (203) causing said swelling portion (186, 188) to be inserted into said inside friction surface (100) by means of moving said rotor body along said axis of the rotor body through said operating member and said elastic member, said actuator causing said operating member to be moved relative to said rotor body against a biasing force of said elastic member after completion of insertion of said swelling portion into said inside friction surface, thereby causing said swelling portion to be expanded radially outwardly of said rotor body, through said tapered portion and said balls.

14. An electronic-component mounting apparatus according to claim 9 wherein said head moving device (50, 52, 54, 56, 58) further has brake means (110) for inhibiting said at least one holding head (70) from rotation thereof by means of engagement of said brake means with the holding head or with a member which is rotatable together with the holding head, while said head rotator (142) has brake-releasing means (218) for releasing said brake means out of said engagement while said head rotator is rotating the holding head.

* * * * *